US006934182B2

(12) United States Patent
Chan et al.

(10) Patent No.: US 6,934,182 B2
(45) Date of Patent: Aug. 23, 2005

(54) METHOD TO IMPROVE CACHE CAPACITY OF SOI AND BULK

(75) Inventors: Yuen H. Chan, Poughkeepsie, NY (US); Louis L. Hsu, Fishkill, NY (US); Rajiv V. Joshi, Yorktown Heights, NY (US); Robert Chi-Foon Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/678,508

(22) Filed: Oct. 3, 2003

(65) Prior Publication Data

US 2005/0073874 A1 Apr. 7, 2005

(51) Int. Cl.[7] .............................................. G11C 11/00
(52) U.S. Cl. ...................................... 365/154; 365/156
(58) Field of Search ............................... 365/154, 156; 257/391, 903

(56) References Cited

U.S. PATENT DOCUMENTS 6,424,015 B1 * 7/2002 Ishibashi et al. ............ 257/391
6,528,897 B2 * 3/2003 Kuwazawa .................. 257/204
6,654,277 B1 * 11/2003 Hsu et al. .................... 365/154
6,791,895 B2 * 9/2004 Higeta et al. ............... 365/226

* cited by examiner

Primary Examiner—Gene N. Auduong
(74) Attorney, Agent, or Firm—Frank V. DeRosa; F. Chau & Associates, LLC

(57) ABSTRACT

Methods for designing a 6T SRAM cell having greater stability and/or a smaller cell size are provided. A 6T SRAM cell has a pair access transistors (NFETs), a pair of pull-up transistors (PFETs), and a pair of pull-down transistors (NFETs), wherein the access transistors have a higher threshold voltage than the pull-down transistors, which enables the SRAM cell to effectively maintain a logic "0" during access of the cell thereby increasing the stability of the cell, especially for cells during "half select." Further, a channel width of a pull-down transistor can be reduced thereby decreasing the size of a high performance six transistor SRAM cell without effecting cell the stability during access. And, by decreasing the cell size, the overall design layout of a chip may also be decreased.

11 Claims, 6 Drawing Sheets

PRIOR ART

METHOD TO IMPROVE CACHE CAPACITY OF SOI AND BULK

TECHNICAL FIELD OF THE INVENTION

The present invention relates generally to digital logic circuits and more particularly, to the design of high performance static random access memories (SRAMs) built for increased stability.

BACKGROUND

Various factors that are considered for L1 cache memory include the size and performance of the type of memory used for implementing an L1 cache. In general, when L1 cache is embedded in a CPU (Central Processing Unit), its performance, e.g. access speed, must be compatible with CPU cycle time. Static random access memories (SRAMs) are primarily used for L1 cache memory as opposed to dynamic random access memories (DRAMs). Indeed, with respect to access speed, SRAM can provide access times of less than 1 ns, while the state-of-the-art DRAMs have access times ranging from 4 ns to 10 ns.

On the other hand, SRAM cells are typically formed with 6 transistors (i.e., 6T Cell), whereas DRAM cells are formed with one transistor and one capacitor. Therefore, memory arrays comprising SRAM cells are much larger than memory arrays comprising DRAM cells. Thus, the maximum capacity of the on-chip cache using SRAM is limited to less than 1M. Therefore, there is a need to increase the cache capacity to extend processor performance in areas such as networking, multimedia and communication.

SRAM design considerations are primarily determined by a particular application. For instance, high performance designs, such as for cache where read and write operations are performed within a short clock cycle, have cell beta ratios (which is defined as the ratio of channel resistance of the pass-gate device, also called transfer device, to that of driver device, also called pull-down device) that are typically around 2.2 to 3.5 to avoid cell disturbances, such as "half-selected cell disturbance," which is well know in the art.

"Half selected cell disturbance" occurs when a word line connected to a memory cell of unselected columns with bit lines biased at a predetermined Vdd is activated. This causes the body voltage of a transfer device of a non-selected cell for a read or write operation along the activated wordline to rise and to be more conductive than a pull-down device, thereby causing a ground state node ("0" node) to switch logic states and disrupt the memory cell.

Typically, in a conventional methodology, a beta ratio is maintained by designing a W/L (width/Length) of the pull-down device over that of the pass-gate device to prevent the disturbance discussed above from effecting cell stability. For example, cells having a high beta ratio (3.5 or greater), will preserve data integrity via a resistive divider. Further, for slower designs, when a cell beta ratio ranges from 1.2 to 1.8, cell disturbances are not a problem because the operation speed of the cell is decreased by the slower devices having a higher Vt.

Depending on the cell structure, these devices can be either a NMOS or a PMOS transistor. For instance, in a 6-transistors SRAM with NMOS pass-gates and pull-down devices, the channel width of the pull-down device is increased to provide an increase in conductivity of the pull-down device thereby increasing the overall stability of the SRAM cell.

FIG. 1 is diagram illustrating a conventional structure of a 6T SRAM cell that comprises six MOS (or FET) transistors. Referring to FIG. 1, an SRAM cell 10 is shown. The SRAM cell (10) is shown to include four N-channel transistors (21A, 21B, 21C, and 21D). The SRAM cell (10) also includes two P-channel transistors (22A) and (22B). The source of transistor (21A) is connected to a first bit line (23), a gate of transistor (21A) is connected to a word line (26), and the drain of transistor (21A) is connected to a first node (27), wherein the first node (27) is connected to the source of transistor (21B) and the drain of transistor (22A). The source of transistor (21C) is connected to a second bit line (24), a gate of transistor (21C) is connected to the word line (26), and the drain of transistor (21C) is connected to a second node (28), wherein the second node (28) is connected to the source of transistor (21D) and the drain of transistor (22B). In addition, the source of transistors (22A) and (22B) are connected to a voltage source (25), and the drain of transistors (21B) and (21D) are connected to a ground (29). Further, the first node (27) is connected to the gate of transistors (21D) and (22B), and the second node (28) is connected to the gate of transistors (21B) and (22A), and wherein one of the storage nodes is pulled low and the other storage node is pulled high. As noted above, although 6T SRAM cells can provide high speed operation and can operate with low power supply voltage, 6T SRAM cells occupy a large area, thus limiting the memory cell density.

The following table shows the tabulated beta ratio vs. cell size in the 0.13 um generation designs:

TABLE 1

| Beta Ratio | Cell Size | Comments |
| --- | --- | --- |
| 1 | 0.96 | Not useful with conventional approach |
| 1.5 | 1 (Normalized) | Standard Cell in bulk CMOS |
| 2.25 | 1.07 | Standard SOI cells |
| 3 | 1.13 | High end designs |
| 3.75 | 1.2 | Safe designs |

Although, in fast switching environments, a SRAM array having a high beta ratio (e.g., 3.75 listed above in table 1) provides for better noise margins, the SRAM array having the high beta ratio requires a larger budget area that not only means higher cost, but also means a decrease in cell performance, such as slower write operation, and a limit on the memory cell density.

Further, a SRAM cell is built on a SOI (silicon on insulation) substrate having a beta ration of 1.50 fails to function properly. This is because SRAM cells built on a SOI substrate are sensitive to extra disturbances due to floating body effects. Even when a SRAM built on a SOI substrate is designed having a beta ratio, e.g., about 2.25, the SOI SRAM stability is still marginal. It has been determined that the floating body effects effectively reduce the beta ratio defined by the device dimension.

In other words, since bit-lines are constantly biased at Vdd, the body voltage of the transfer device tends to rise and to be more conductive than the pull-down device, which may cause the ground state node ("0" node) to switch logic states, e.g., switch from a logic state of "0" to a logic state "1." Currently, the solution is simply to increase the width of the channel of the pull-down device to lower its threshold voltage (Vt). However, this increases the SRAM cell size which then increases the overall design area budget of a chip.

In FIG. 2, a conventional cell having a beta ratio of two, which ensures minimal cell stability from SRAM in the bulk substrate is shown. A SRAM on a SOI substrate having a higher beta ratio may be desirable because of an increase in stability, but there is also an increase in the size of the SRAM array that increase the area budget of the overall chip layout.

Now referring to FIG. 2, FIG. 2 shows a conventional 6T SRAM layout with passgates having a Voltage threshold of 0.3 V, a beta of 2, cell size of 2.65 um$^2$, and Ldesign of 0.12 um. In addition, RX is the active silicon, PC is polysilicon, and NW is the nwell for the PFETs, P1 and P2. P1 and P2 are pull-up devices. N1 and N2 are pull-down devices, NFETs, having a W/L of about 0.36 um and about 0.12 um, respectively. Further, NL and NR are the left and right passgate devices, NFETs, having a W/L of about 0.18 um and about 0.12 um, respectively.

Therefore, a need exists to increase the cache capacity on a chip to extend processor performance in areas such as networking, multimedia and communication, while keeping within the designated area budget of the overall chip design and increasing the SRAMs stability.

SUMMARY OF THE INVENTION

Exemplary embodiments of invention include methods for designing high performance static random access memories (SRAMs) built for increased stability, and for designing high performance static random access memories (SRAMs) by decreasing a SRAM cell size and maintaining cell stability to decrease the overall design layout of a chip.

In general, the exemplary embodiments of invention provide a SRAM cell design including a passgate device having a higher voltage threshold than a pull-down device. The threshold voltage of the passgate device is increased by ion implant with a critical mask. This facilitates forming a passgate device having a decreased layout area and thus reduces the overall size of a SRAM layout. The benefits of this design and method are minimizing access disturbances during read/write operations and decreasing a SRAM cell size. The design and method also provides a 6T SRAM cell of the same size as conventional 6T SRAM cell while increasing overall cell stability.

According to an exemplary embodiment of the present invention, a static random access memory cell is provided comprising a first and second pass-gate transistor, a first and second storage node, wherein the first passgate transistor is connected between a first bit line and a first storage node, wherein a gate terminal of the first passgate transistor connects to a word line, and the second passgate transistor is connected between a second bit line and the second storage node, wherein a gate terminal of the second passgate transistor connects to the word line.

The cell also comprises a first pull-up device, connected between a source voltage and the first storage node, a second pull-up device, connected between the source voltage and the second storage node, a first pull-down transistor, connected between the first storage node and a ground, wherein a gate terminal of the first pull-down transistor is connected to the second storage node, and a second pull-down transistor, connected between the second storage node and the ground, wherein a gate terminal of the second pull-down transistor is connected to the first storage node, wherein the first and second passgate transistors have first threshold voltages that are substantially the same, and wherein the first and second pull-down transistors have second threshold voltages that are substantially the same, and wherein the first threshold voltages are greater than the second threshold voltages.

Preferably, the first and second threshold voltages are about 0.7 V and about 0.3 V, respectively.

The memory cell may further comprise the first and second passgate transistor having first channel widths that are substantially the same, and the first and second pull-down transistor having second channel widths that are substantially the same, and wherein the second channel widths are greater than the first channel widths. Preferably, the memory cell has a cell beta ratio of about 3.0.

The memory cell may further include the first pull-up device is a first pull-up transistor and the second pull-up device is a second pull-up transistor, wherein the first pull-up transistor is connected between a source voltage and the first storage node, and wherein a gate terminal of the first pull-up transistor connects to the second storage node, and wherein the second pull-up transistor is connected between the source voltage and the second storage node, and wherein a gate terminal of the second pull-up transistor is connected to the first storage node.

According to another exemplary embodiment of the present invention. The memory cell discussed above may have first and second passgate transistors having first channel widths that are substantially the same, and first and second pull-down transistors having second channel widths that are substantially the same, and wherein the second channel widths and the first channel widths are substantially the same with a cell beta ration is about 1. Preferably, the first and second threshold voltages are about 0.7 V and about 0.3 V, respectively. In addition, the memory cell size is about 2.40 um$^2$.

According to yet another exemplary embodiment of the present invention, a 6-transistor static random access memory cell is provided comprising a first and second bit line terminal, a first and second storage node, a wordline, a first NFET access transistor connected between the first bit line terminal and the first storage node, wherein a gate terminal of the first access transistor is connected to a wordline.

The 6T SRAM above also comprises a second NFET access transistor connected between the second bit line terminal and the second storage node, wherein a gate terminal of the second access transistor is connected to a wordline, a first PFET pull-up transistor connected between a voltage source and the first storage node, wherein a gate terminal of the first pull-up transistor is connected to the second storage node, a second PFET pull-up transistor connected between a voltage source and the second storage node, wherein a gate terminal of the second pull-up transistor is connected to the first storage node, a first NFET pull-down transistor connected between the first storage node and a ground, wherein a gate terminal of the first pull-down transistor is connected to the second storage node, and a second NFET pull-down transistor connected between the second storage node and a ground, wherein a gate terminal of the second pull-down transistor is connected to the first storage node.

Further, the first and second access transistor may have first threshold voltages that are substantially the same, and the first and second NFET pull-down transistors may have second threshold voltages that are substantially the same, wherein the second threshold voltages are greater than the first threshold voltages.

According to still another exemplary embodiment of the present invention, a memory system is provided comprising a memory array comprising an array of memory cells formed on a semiconductor substrate arranged in rows and columns, wherein a row of memory cells is commonly connected to a wordline and wherein a column of memory cells is commonly connected to a bit line pair.

In addition, the memory system has a controller for generating address and command signals, and decoding circuity for decoding the address and command signals to access memory cells in the memory array, wherein each memory cell in the memory array comprises a 6-transistor static random access memory (SRAM) cell, wherein the 6-transistor SRAM may comprise any of the features in the embodiments discussed above.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be constructed as limited to the embodiments set forth herein. Rather, these embodiments are provided so that this disclosure will be thorough and complete, and will fully convey the spirit and scope of the invention to those skilled in the art.

The exemplary embodiments of invention provide a SRAM cell design including a passgate device having a higher voltage threshold than a pull-down device. A threshold voltage of the passgate device is increased by ion implant with a critical mask. This facilitates forming a passgate device having a decreased layout area and thus reducing the overall size of a SRAM layout. The benefits of this design and method are minimizing access disturbances during read/write operations and decreasing a SRAM cell size. By employing this method, a layout of a SRAM cell can be reduce by about 15% or greater than the existing conventional approach.

Figure 3:
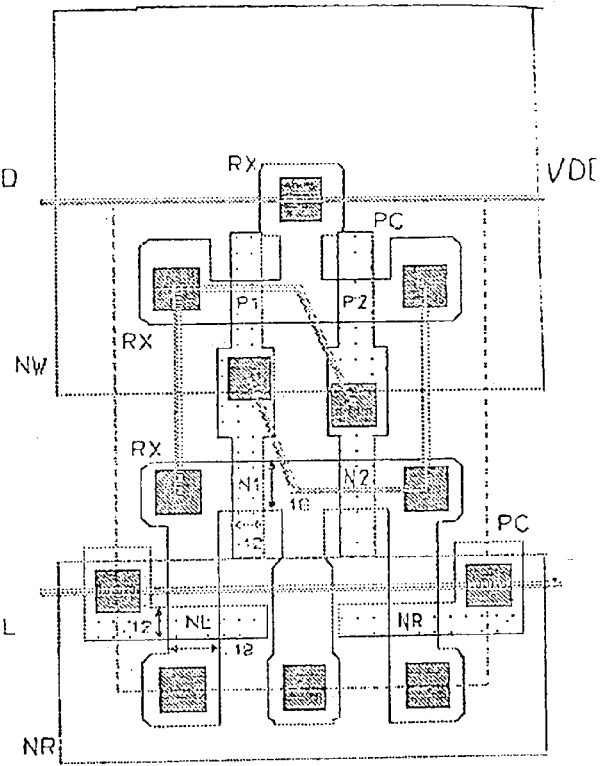
FIG. 3 depicts a SRAM layout, according to an embodiment of the present invention.

FIG. 3 shows a 6T SRAM layout designed in accordance with an embodiment of the present. Referring to FIG. 3, FIG. 3 shows a 6T SRAM layout with a high Vt implant in a passgate device, a beta ratio of 1, cell size of 2.40 um$^2$, and Ldesign of 0.12 um. In addition, RX is the active silicon, PC is polysilicon, and NW is the nwell for the PFETs, P1 and P2. P1 and P2 are pull-up devices. N1 and N2 are pull-down devices, NFETs, having a W/L of about 0.18 um and about 0.12 um, respectively. Further, NL and NR are the left and right passgate devices, NFETs, having a W/L of about 0.18 um and about 0.12 um, respectively. The passgate devices (NL and NR) have greater voltage thresholds (Vt) than the pull-down devices (N1 and N2). Preferably, the Vt for the passgate devices (NL and NR) is about 0.6 V, and the Vt for the pull-down devices (N1 and N2) is about 0.3 V.

Although the embodiment discussed above discloses that the pull-down devices (or load devices) are PFETs, it is to be understood that embodiments of the invention are also applicable to other types of SRAM cells such as SRAMs with a resistive load or SRAMs with TFT (thin film transistor) load. More specifically the load devices may be PN-junction diodes, diode-connected field effect transistors (FETs), resistors, normal PMOS devices, or any like devices.

Figure 2:
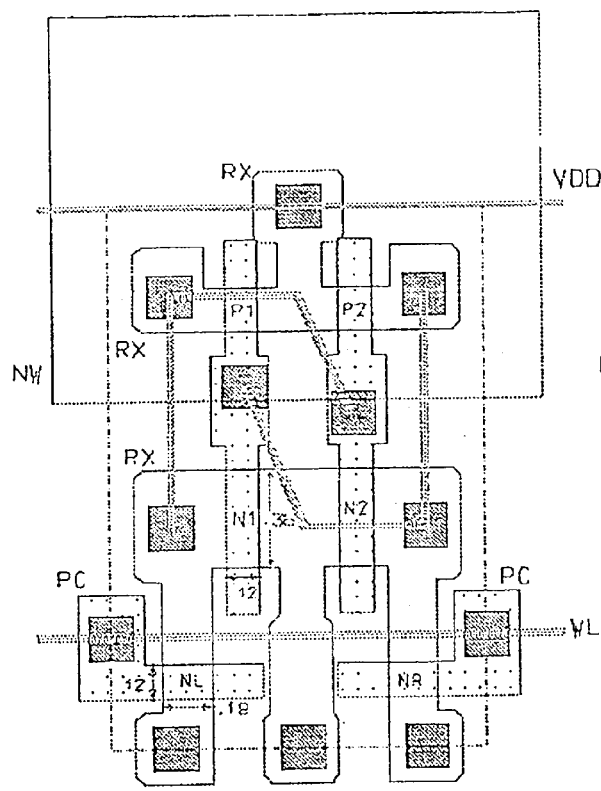
FIG. 2 depicts a conventional SRAM layout.

Comparing the conventional 6T SRAM layout depicted in FIG. 2 to the layout in FIG. 3 according to an embodiment of the current invention, the 6T SRAM cell of FIG. 3 has a design beta ratio of one with a much higher electrical beta ratio. Design beta ratio is the ratio of the layout W/L of the pull-down device to the layout W/L of the passgate device, and the electrical beta ratio is the ratio of the channel resistance of the passgate device to the channel resistance of the pull-down device. In addition, the channel widths of the pull-down devices are reduce by half. In other words, the width of the pull-down devices shown in FIG. 3 is about 0.18 um, and the size of the SRAM cell is about 2.40 um$^2$. This-equates to a 9.5% area savings in the cell depicted in FIG. 3 as compared to the conventional cell depicted in FIG. 2.

Figure 4:
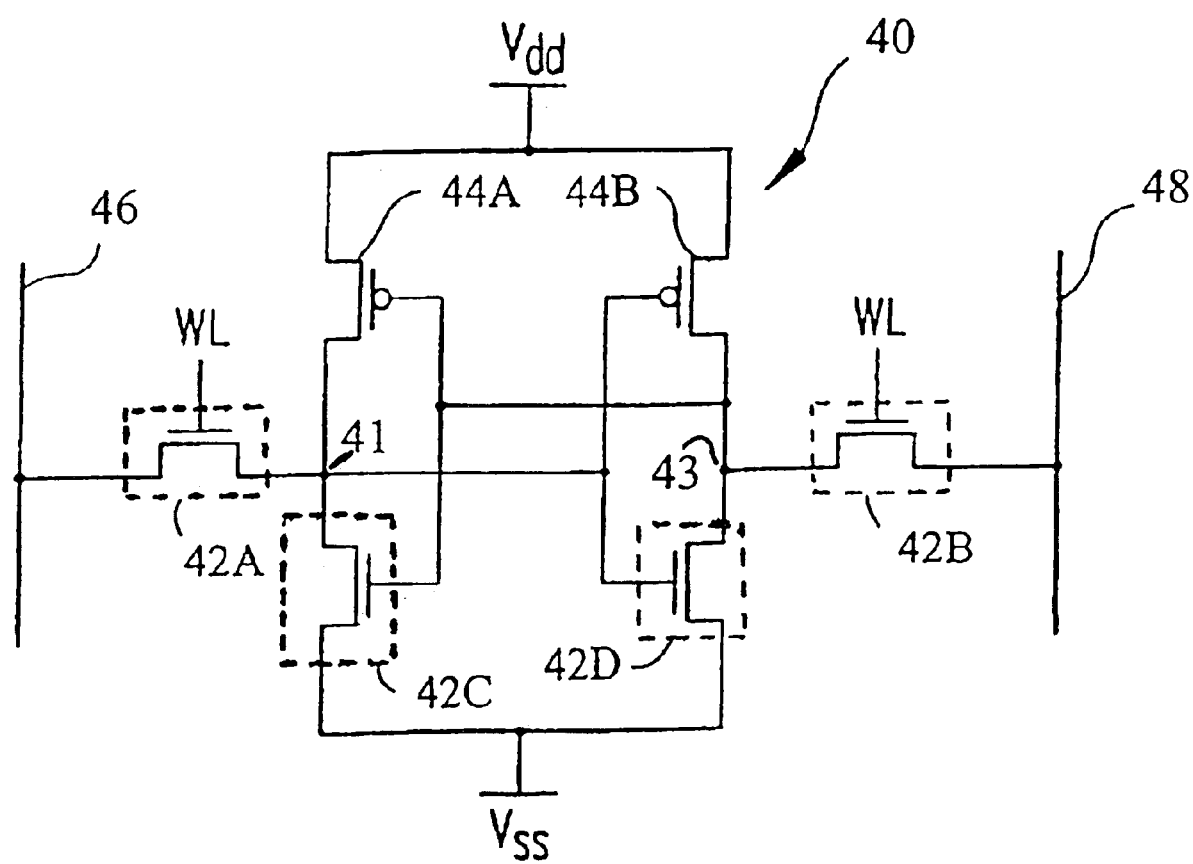
FIG. 4 is a schematic of a 6T SRAM cell, according to an embodiment of the present invention.

FIG. 4 is a schematic of a 6T SRAM cell, according to another exemplary embodiment of the present invention. Referring to FIG. 4, a SRAM cell (40) is shown having four N-channel transistors (42A, 42B, 42C, and 42D). N-channel transistors (42A and 42B) are first and second passgate devices, respectively, and N-channel transistors (42C and 42D) are first and second pull-down devices, respectively. The 6T SRAM cell also includes two P-channel transistors (44A and 44B), which are first and second pull-up devices, respectively. The Vt of the first and second passgate devices (42A and 42B) are the same. The Vt of the first and second pull-down devices (42C and 42D) are the same. Further, the Vt of the first and second passgate devices (42A and 42B) is greater than the Vt of the first and second pull-down devices (42C and 42D). Preferably, the Vt of the passgate devices (42A and 42B) is about 0.7 V, and the Vt of the pull-down devices (42C and 42D) is about 0.3 V.

In addition, bit lines (46 and 48) are connected to the first and second passgates (42A and 42B), respectively. The first and second passgates (42A and 42B) are connected to a first storage node (41) and a second storage (43), respectively. Each of the first and second passgates also have a gate connected to a wordline (not shown). The first pull-up device (44A) is connected to a voltage source (Vdd) and the first storage node (41). The second pull-up device (44B) is connected to the voltage source (Vdd) and second storage node (43). In addition, the first and second pull-ups have a gate, wherein the gate of the first pull-up (44A) is connected to the second storage node (43) and the gate of the second pull-up (44B) is connected to the first storage node (41). The first and second pull-down devices (42C and 42D) are connected to a common ground, and the first and second pull-down devices (42C and 42D) have a gate. The first pull-down (42C) is also connected to the first storage (41), and the gate of the first pull-down (42C) is connected the second storage node (43). The second pull-down (42D) is also connected the second storage node (43), the gate of the second pull-down (42D) is connected the first storage node (41).

Further, cell stability can be determined by the ratio of the conductivity of the pull-down device verses the conductivity of the passgate device. By reducing the passgate conductivity, by increasing the Vt (voltage threshold) of the passgate by ion implant with a critical mask step, the capacity of a SRAM cell is increased more efficiently than by the conventional method of increasing the W/L of the pull-down device. In addition, a high-precision mask alignment can be carried out using any conventional deep-UV exposure tool.

The embodiments discussed above maintain the data state of a node (e.g., a logic "0" at a zero node) and cell stability by increasing the Vt of a passgate device such that the Vt of the passgate device is greater than the Vt of a pull-down device within a 6T SRAM cell. In other words, the leakage current flowing from an outside source, e.g., a bit line biased a Vdd, to a zero node is less than the current being drawn from the zero node through the pull-down device, e.g., a NFET transistor connected to a ground.

Since actual cell stability is dictated by the ratio of conductivity of a pull-down device verses the conductivity of a passgate device, the design layout of a conventional SRAM cell can be reduced without effecting the stability of a SRAM cell by increasing the Vt (threshold Voltage), by implantation, of a passgate device and reducing the channel width of a pull-down device, as shown in the comparison of FIGS. 2 and 3.

Figure 5:
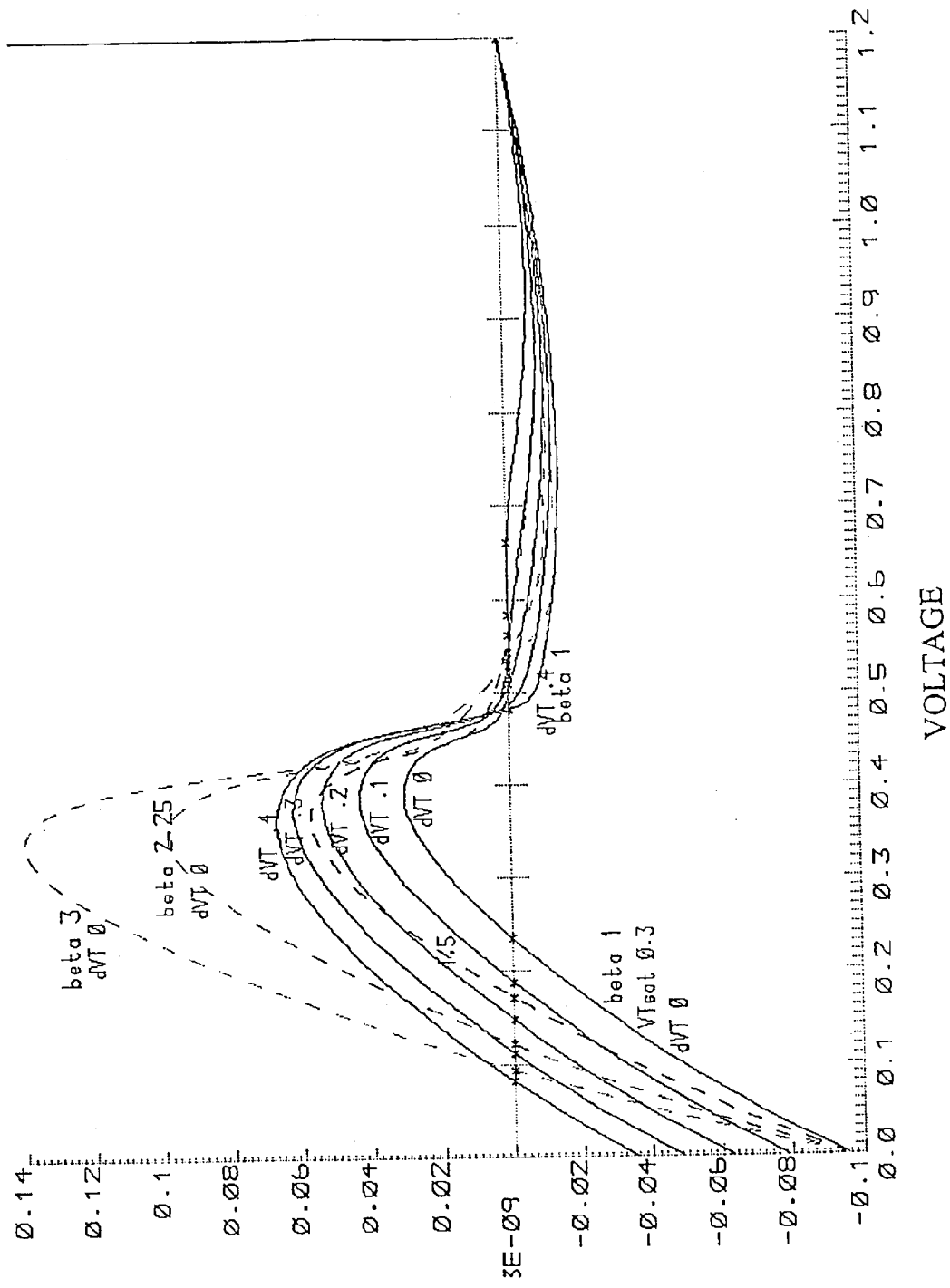
FIG. 5 is a graph illustrating a "N-curve" to provide SRAM cell noise margin information for "half-selected" cells, according to an embodiment of the present invention.
Figure 6:
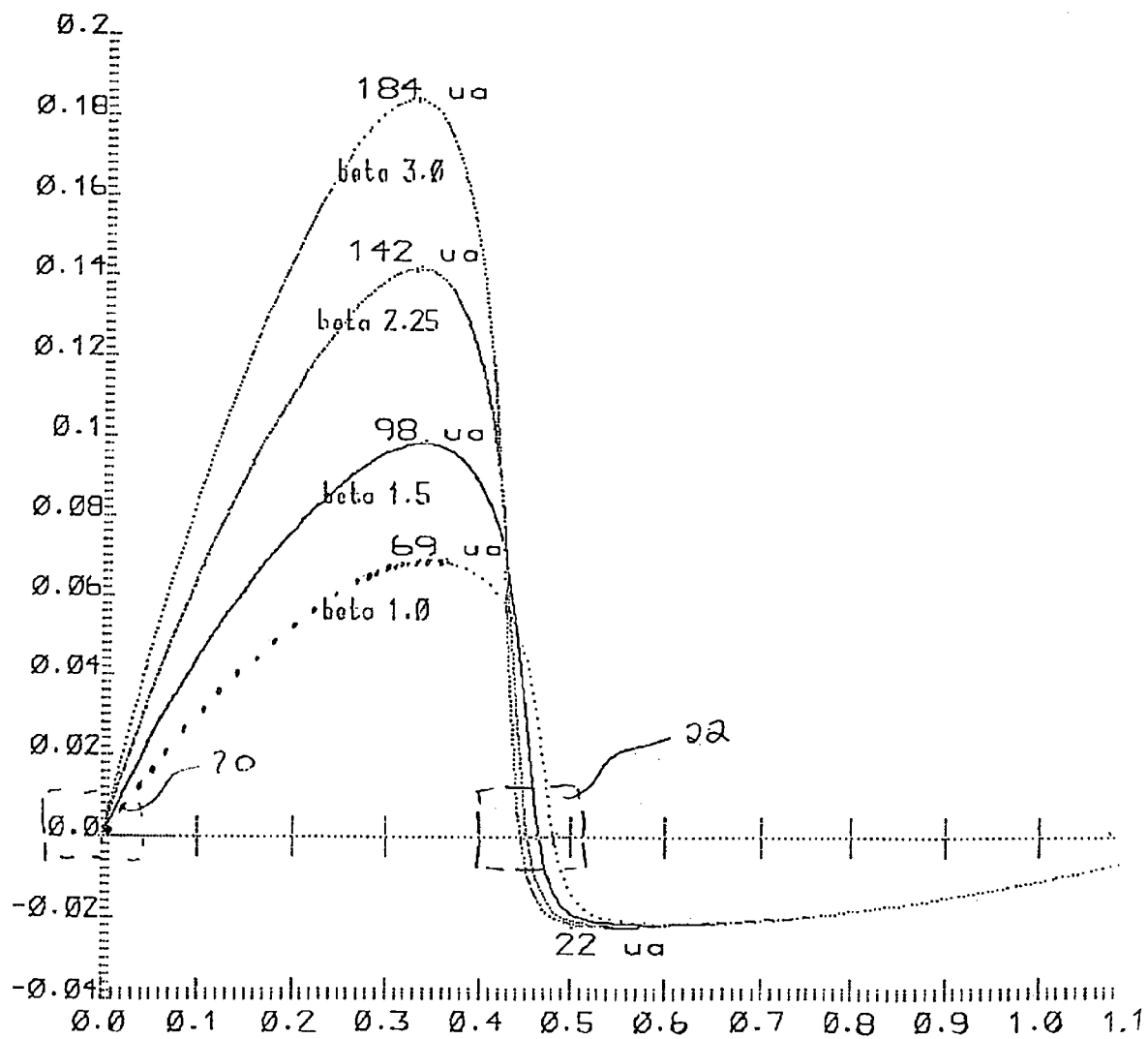
FIG. 6 is a graph illustrating a "N-curve" to provide cell noise margin information during standby, according to an embodiment of the present invention.
Figure 7:
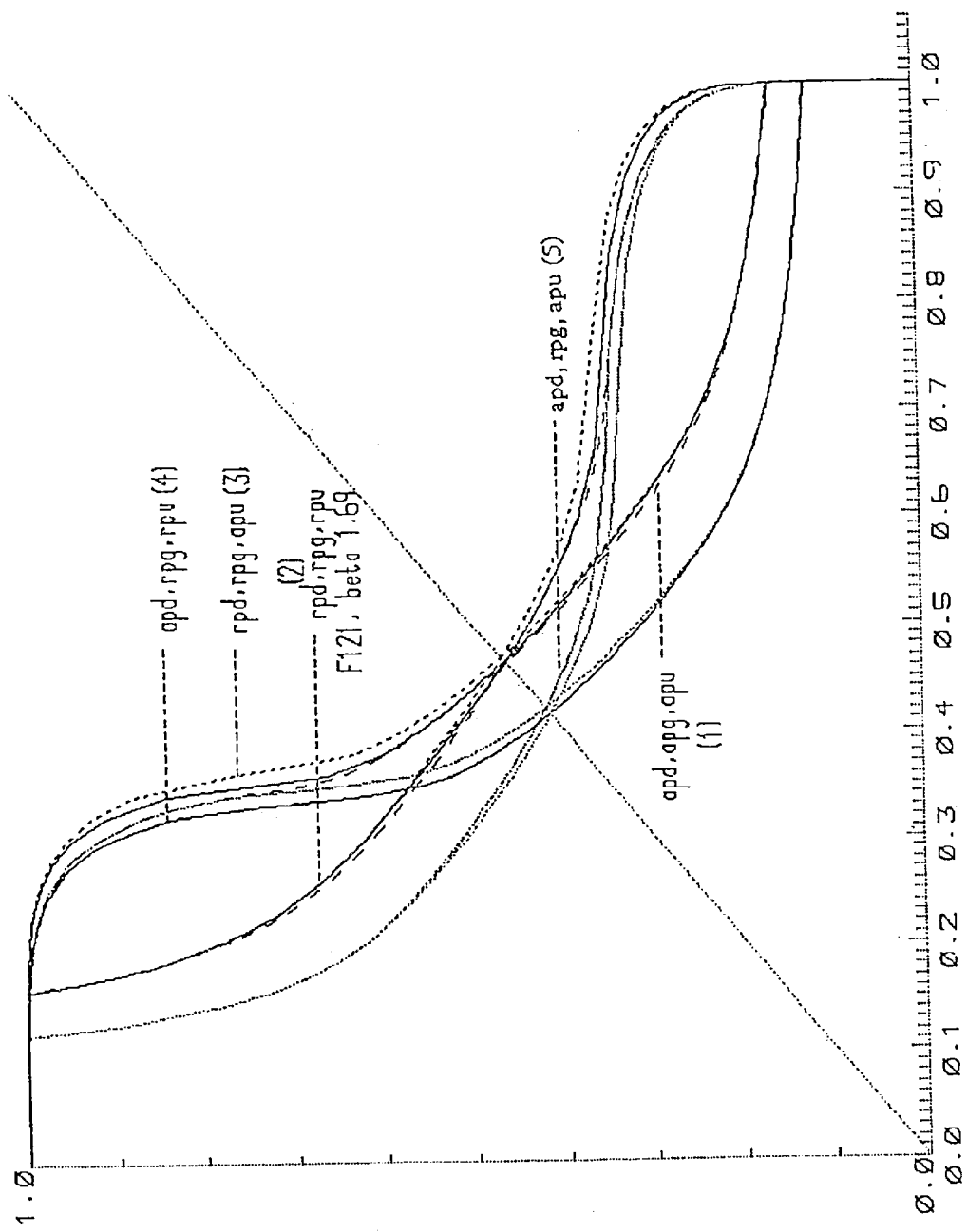
FIG. 7 is a conventional butterfly plot showing the improvements of the voltage margins with the dual Vt layout, according to the embodiments of the present invention.

FIGS. 5–7 are created from circuit simulations of a design with the above embodiments using a circuit analysis tool such as HSPICE.

Cell stability can be characterized with a "N-curve." An N-curve is an I-V plot of a node current when that node is forced from below GND to above VDD. This N-curve provides the noise margin information of an SRAM cell.

FIG. 5 is a graph illustrating a "N-curve" that provides SRAM noise margin information for a "half-select" cells, according to an embodiment of the present invention. Now referring to FIG. 5, in this example, the wordline (WL) is set at VDD=1.2V, and the unselected BLs (Bit Lines) are also set at the standby bias of VDD=1.2V. When the cell node is forced from GND to VDD, the current of the voltage source will cross the zero current axis 3 times if the cell remains stable. The dotted lines represent SRAM cells having different beta ratios. The solid lines represent SRAM cells having varying implants. The voltage noise margin Vnm0 is defined by the voltage difference of the left intercept 10 and the middle intercept 12. The voltage noise margin Vnm1 is defined by the voltage difference between the middle intercept 12 and the right intercept (not shown). The current noise margin Inm0 is the peak current between the first intercept 10 and the middle intercept 12. The current noise margin Inm1 is the-peak current between the middle intercept 12 and the right intercept (not shown). For a cell of beta 2.25, Inm0 is about 100 $\mu$A. This illustrates that the pull-down NFET is strong enough to absorb some of the noise current leakage of 100 $\mu$A into the low node during the circuit operations in the "half-select" mode.

Figure 1:
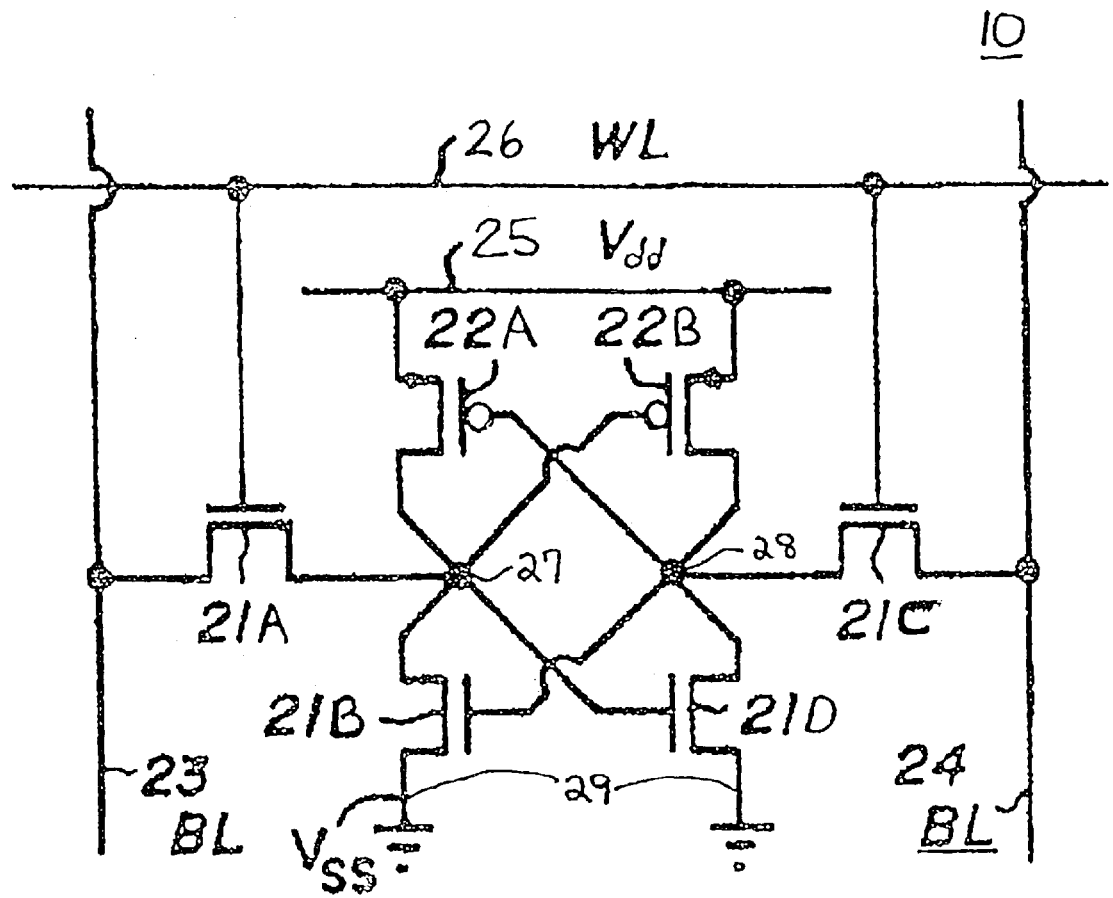
FIG. 1 is diagram illustrating a conventional structure of a 6T SRAM cell.

In other words, the maximum current peak as shown in the InmO portion of FIG. 1 is the maximum current a ground node can absorb when the cell is disturbed. Further, if the leakage current exceeds the maximum current, the ground will drift upward and change a logic state of a storage node from "0" to "1," thereby changing the overall state of the memory cell.

Since the pull up PFETs remain the same size, the Inm1 is relatively insensitive to the beta ratio. In a bulk CMOS SRAM, the standard cell of beta 1.5 can tolerate an inward leakage in the voltage noise margin Inm0 of 60 $\mu$A.

Since the passgate conductivity is more sensitive to Vt than the W/L, noise margins are equally sensitive to the Vt of the passgate. It can be seen from FIG. 5, a cell having a beta of 1.0 with passgate Vt saturation (threshold voltage at saturation) of 0.5 V is as stable as a cell having a beta of 1.5 with a passgate Vt saturation of 0.3 V. The Inm0 is mainly dependent on the W/L of the pull-down device, but it is also proportional to the beta ratio. A channel implant is provided to mainly cut down on the current leakage from the bit line(s) to the cell. The benefits of this are reflected by the more balanced margins in the N-curve, as shown in FIG. 6. Further, the weakest margin is the Inm1 region of FIG. 6 cannot be helped by a higher beta ratio or higher Vt implant of a passgate device because the pull-up transistors, PFETs, are always the same minimum size and the cell tolerance for outward current leakage Inm1 is about the same for all beta ratios.

Further, a more precise measurement of cell stability would be to determine the power noise margin (Pnm1), for the integral of I over V, from the middle intercept to the right intercept. In other words, Pnm1 represents cell stability against a disturbance from "1" state to the "0" state. Thus, a cell having a large Pnm1 is stable even though the Inm1 (or Vnm1) of the cell may not be large.

It has been determined that a cell having passgates with a Vt of 0.7 V and a beta of 1 is more stable than a cell having a beta of 3 with passgates having a Vt of 0.3 v. In addition, a cell having passgates with a Vt of 0.6V and a beta 1 is more stable than the cell at beta 2.25 with passgates having a Vt of 0.3 v.

Further, by increasing the passgate threshold voltage implant and maintaining a high cell beta ratio (e.g., 3.0 or greater), the cell stability is improved during array access, especially for the cells in a "half-select mode."

FIG. 6 is a graph illustrating a "N-curve" to provide cell noise margin information for SRAM cells during standby. During standby, the cell noise margins are greater because there is no base access current leakage from the bit lines to the cell. With the passgate off, passgate threshold voltage implants have no effect on stability. Now referring to FIG. 6, Inm0 is defined by the voltage difference of a first intercept 20 and a second intercept 22. While the Inm0 ranges from 69 to 184 uA, Inm1 is about 22 uA. This weakness of 22 uA cannot be helped by beta ratios nor channel implants. Since the pull up PFETs are always the same minimum size, the cell tolerance for outward current leakage Inm1 is about the same for all beta ratios.

FIG. 7 is a conventional butterfly plot showing the improvements of the voltage margins with the dual Vt layout, according to an embodiment of the present invention. Referring to FIG. 7, FIG. 7 shows the butterfly plots of a standard SRAM cell of the 90 nm node CMOS technology, with different combinations of Vt implants on the six transistors. For instance, "rpd" signifies regular Vt of a pull-down device, while "apd" signifies alternative Vt of the pull-down device. The alternate Vt is about 10% lower than the regular Vt. Similarly, "rpg" and "apg" signify a regular Vt of a passgate device and alternative Vt passgate of the passgate device, respectively. In addition, "rpu" and "apu" signify a regular Vt of a pull-up device and alternative Vt of the pull-up device, respectively.

The most stable SRAM cell is the cell having the largest Static Noise Margin (SNM). SNM is determined by measuring the diagonal of the largest square that can fit inside a butterfly wing. As shown in FIG. 7, SRAM cell (1), which corresponds to apd, rpg, and apu, is the least the stable because it has the smallest SNM, or the shortest diagonal line within its corresponding square. The combination of apd, apg, and rpu, which is not shown in FIG. 7, would create a cell having an even smaller SNM than cell (1). The most stable cell shown in FIG. 7 is cell (5), which corresponds to apd, rpg, and apu, because it has the largest SNM, or the longest diagonal line within its corresponding-square.

It is to be understood that 6T SRAM cells according to embodiments of the invention as described herein, can be implemented in any memory system architecture. For instance, a memory system in which the invention may be implemented comprises a memory array having an array of 6T SRAM memory cells formed on a semiconductor substrate and arranged in rows and columns, wherein a row of memory cells is commonly connected to a wordline and wherein a column of memory cells is commonly connected to a bit line pair. The memory system further comprises a controller (e.g., CPU, memory controller, etc.) for generating address and command signals for performing memory access operations. Further, the memory system includes decoding circuity (e.g., wordline address and column address decoders, etc.) for decoding the address and command signals received from the controller as well as circuity (e.g., sense amplifiers, wordline drivers, etc.) for accessing data of the memory cells in the memory array.

While the present invention has been particularly shown and described with reference to preferred embodiments thereof, it will be understood by those of ordinary skill in the art that various changes in form and detail may be made therein without departing from the spirit and scope of the present invention as defined by the following claims.

What is claimed is:

1. A static random access memory device, comprising:
   a memory comprising an array of memory cells, each memory cell comprising;
   a first and second passgate transistor;
   a first and second storage node, wherein the first passgate transistor is connected between a first bit line and a first storage node, wherein a gate terminal of the first passgate transistor connects to a word line, and the second passgate transistor is connected between a second bit line and the second storage node, wherein a gate terminal of the second passgate transistor connects to the word line;
   a first pull-up transistor, connected between a source voltage and the first storage node, wherein a gate terminal of the first pull-up transistor is connected to the second storage node;
   a second pull-up transistor, connected between the source voltage and the second storage node, wherein a gate terminal of the first pull-up transistor is connected to the first storage node;
   a first pull-down transistor, connected between the first storage node and a ground, wherein a gate terminal of the first pull-down transistor is connected to the second storage node; and
   a second pull-down transistor, connected between the second storage node and the ground, wherein a gate terminal of the second pull-down transistor is connected to the first storage node;
   wherein the first and second passgate transistors and the first and second pull-down transistors have first threshold voltages that are substantially the same, and wherein the first and second pull-up transistors have second threshold voltages that are substantially the same, and wherein the first threshold voltages are greater than the second threshold voltages.

2. The memory device of claim 1, wherein the first threshold voltages are a first voltage that is in a range of about 0.7 V to about 0.3 V and wherein the second threshold voltages are a second voltage that is about 10% lower than the first voltage.

3. The memory device of claim 1, wherein the first and second access transistors are NFETs, the first and second passgate transistors are NFETs, and wherein the first and second pull-up transistors are PFETs.

4. The memory device of claim 1, wherein each memory cell has a cell beta ratio of about 2.0 or greater.

5. A static random access memory device, comprising:
   a memory comprising an array of memory cells, each memory cell comprising:
   a first and second passgate transistor;
   a first and second storage node, wherein the first passgate transistor is connected between a first bit line and a first storage node, wherein a gate terminal of the first passgate transistor connects to a word line, and the second passgate transistor is connected between a second bit line and the second storage node, wherein a gate terminal of the second passgate transistor connects to the word line;
   a first pull-up transistor, connected between a source voltage and the first storage node, wherein a gate terminal of the first pull-up transistor is connected to the second storage node;
   a second pull-up transistor, connected between the source voltage and the second storage node, wherein a gate terminal of the second pull-up transistor is connected to the first storage node;
   a first pull-down transistor, connected between the first storage node and a ground, wherein a gate terminal of the first pull-down transistor is connected to the second storage node; and
   a second pull-down transistor, connected between the second storage node and the ground, wherein a gate terminal of the second pull-down transistor is connected to the first storage node;
   wherein the first and second pull-down transistors, the first and second pull-up transistors and the first and second passgate transistors all have first threshold voltages that are substantially the same, wherein the first threshold voltage is a voltage in a range of about 0.3 V to about 0.7 V.

6. The memory device of claim 5, wherein the first and second access transistors are NFETs, the first and second passgate transistors are NFETs, and wherein the first and second pull-up transistors are PFETs.

7. The memory device of claim 5, wherein each memory cell has a cell beta ratio of about 2.0 or greater.

8. A static random access memory device, comprising:
   a memory comprising an array of memory cells, each memory cell comprising:
   a first and second passgate transistor;
   a first and second storage node, wherein the first passgate transistor is connected between a first bit line and a first storage node, wherein a gate terminal of the first passgate transistor connects to a word line, and the second passgate transistor is connected between a second bit line and the second storage node, wherein a gate terminal of the second passgate transistor connects to the word line;
   a first pull-up transistor, connected between a source voltage and the first storage node, wherein a gate terminal of the first pull-up transistor is connected to the second storage node;

a second pull-up transistor, connected between the source voltage and the second storage node, wherein a gate terminal of the second pull-up transistor is connected to the first storage node;

a first pull-down transistor, connected between the first storage node and a ground, wherein a gate terminal of the first pull-down transistor is connected to the second storage node; and a second pull-down transistor, connected between the second storage node and the ground, wherein a gate terminal of the second pull-down transistor is connected to the first storage node;

wherein the first and second passgate transistors have first threshold voltages that are substantially the same, and wherein the first and second pull-up transistors and the first and second pull-down transistors have second threshold voltages that are substantially the same, and wherein the first threshold voltages are greater than the second threshold voltages.

9. The memory device of claim 8, wherein the first threshold voltages are a first voltage that is in a range of about 0.7 V to about 0.3 V and wherein the second threshold voltages are a second voltage that is about 10% lower than the first voltage.

10. The memory device of claim 8, wherein the first and second access transistors are NFETs, the first and second passgate transistors are NFETs, and wherein the first and second pull-up transistors are PFETs.

11. The memory device of claim 8, wherein each memory cell has a cell beta ratio of about 2.0 or greater.

* * * * *